(12) United States Patent
Kim et al.

(10) Patent No.: US 7,601,982 B2
(45) Date of Patent: Oct. 13, 2009

(54) ORGANIC LIGHT EMITTING DISPLAY AND FABRICATING METHOD THEREOF

(75) Inventors: Jongyun Kim, Yongin-si (KR); Byoungdeog Choi, Yongin-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 11/785,044

(22) Filed: Apr. 13, 2007

(65) Prior Publication Data

US 2008/0111125 A1 May 15, 2008

(30) Foreign Application Priority Data

Nov. 10, 2006 (KR) .................. 10-2006-0111299

(51) Int. Cl.
*H01L 35/24* (2006.01)

(52) U.S. Cl. .................. 257/40; 257/79; 257/435; 257/436; 257/13

(58) Field of Classification Search .................. 257/13, 257/40, 79, 435, 436
See application file for complete search history.

(56) References Cited

U.S. PATENT DOCUMENTS

| 5,811,866 | A | 9/1998 | Hirata | |
|---|---|---|---|---|
| 6,559,594 | B2 * | 5/2003 | Fukunaga et al. | ........... 313/506 |
| 2001/0011868 | A1 | 8/2001 | Fukunaga | |
| 2003/0020124 | A1 | 1/2003 | Guenther | |
| 2004/0129960 | A1 * | 7/2004 | Maruyama et al. | ........... 257/288 |
| 2004/0253838 | A1 * | 12/2004 | Yamazaki et al. | ........... 438/795 |
| 2005/0029926 | A1 * | 2/2005 | Park et al. | ........... 313/500 |
| 2005/0046783 | A1 * | 3/2005 | Kawata et al. | ........... 349/187 |
| 2005/0285522 | A1 | 12/2005 | Han | |
| 2008/0111126 | A1 | 5/2008 | Kim et al. | |
| 2008/0111477 | A1 | 5/2008 | Kim et al. | |
| 2008/0128683 | A1 | 5/2008 | Kim et al. | |
| 2008/0142791 | A1 | 6/2008 | Kim et al. | |

FOREIGN PATENT DOCUMENTS

| JP | 2002-350833 | 12/2002 |
|---|---|---|
| JP | 2003173872 | 6/2003 |
| JP | 2005-222789 | 8/2005 |
| JP | 2005-222930 | 8/2005 |
| JP | 2005-340182 | 12/2005 |
| KR | 10-2003-0054777 | 7/2003 |

(Continued)

OTHER PUBLICATIONS

U.S. Appl. No. 11/785,099, filed Apr. 13, 2007, Kim et al.

(Continued)

*Primary Examiner*—N Drew Richards
*Assistant Examiner*—Jae Lee
(74) *Attorney, Agent, or Firm*—Robert E. Bushnell, Esq.

(57) ABSTRACT

A thin organic light emitting device that can be used in thin devices like mobile phones and personal digital assistants. An organic light emitting display (OLED) includes a layer that blocks UV rays so that the diode and the transistor are shielded from UV rays during and after production. In order to prevent breakage during production, two substrates are bonded together and the devices are formed on each of the two substrates, providing a thicker structure that is less apt to break. The substrates are separated after production is complete.

5 Claims, 7 Drawing Sheets

FOREIGN PATENT DOCUMENTS

| | | |
|---|---|---|
| KR | 10-2003-0069434 | 8/2003 |
| KR | 10-2005-0012958 | 2/2005 |
| KR | 10-2005-0029826 | 3/2005 |
| KR | 10-2007-0047633 | 5/2007 |

OTHER PUBLICATIONS

U.S. Appl. No. 11/785,098, filed Apr. 13, 2007, Kim et al.
U.S. Appl. No. 11/785,043, filed Apr. 13, 2007, Kim et al.
U.S. Appl. No. 11/785,101, filed Apr. 13, 2007, Kim et al.

* cited by examiner

ORGANIC LIGHT EMITTING DISPLAY AND FABRICATING METHOD THEREOF

CLAIM OF PRIORITY

This application makes reference to, incorporates the same herein, and claims all benefits accruing under 35 U.S.C.§119 from an application for ORGANIC LIGHT EMITTING DISPLAY AND FABRICATING METHOD THEREOF earlier filed in the Korean Intellectual Property Office on 10 Nov. 2006 and there duly assigned Serial No. 10-2006-0111299.

BACKGROUND OF THE INVENTION

1. Field of the Invention

The present invention relates to a thin organic light emitting display that can be used in thin devices like mobile phones, personal digital assistants etc, and where UV-rays cannot be transmitted to an organic light emitting diode via a substrate during fabrication or after fabrication, and a method of making where the substrate is not bent or damaged during fabrication and where the time of making is reduced.

2. Description of the Related Art

An organic light emitting diode (OLED) drives a current to fluorescent or phosphorescent organic material, where electrons and holes are combined, causing the OLED to emit light. An OLED displays an image by voltage programming or current programming on, for example, a matrix of n rows and m columns.

A basic OLED includes an anode, an organic thin film layer, and a cathode electrode. As illustrated in FIG. 1, the organic thin film layer can include an emitting layer (EML) that emits light by forming an excitons upon recombination of electrons and holes, an electron transport layer (ETL) that regulates the velocity of the flow of electrons, and a hole transport layer (HTL) that regulates the velocity of the flow of holes, an electron injection layer (EIL) that improves the injection efficiency of electrons can be formed on the electron transport layer, and a hole-injecting layer (HIL) that improves the injection efficiency of holes can be formed on the hole transport layer.

An OLED can be used as a moving picture display of a small or a large size because of advantages such as a wide-viewing angle, high response speed, and self-emission. The OLED consumes little power, and because a back light is not necessary, and can be fabricated lightly in a flat-panel display. The OLED can be fabricated at a low temperature, and because of the simple fabricating process, it can be fabricated at a low price. Recently, along with rapid development of organic thin-film material-related technologies, the OLED is being considered as a growing technology in the flat panel display market.

However, since electronic applications such as mobile phones, a personal digital assistants, a lap-top computers, computer monitors, and televisions are being made slim, there is a need to fabricate OLED to a thickness of less than 1 mm. However, because a protective film technology that can serve as a substitute to encapsulation technology has not been fully developed, it is difficult to make the thickness of an OLED less than 1 mm.

In order to fabricate an OLED to a thickness of less than 1 mm, JP 2005-340182, JP 2005-222930, and JP 2005-22789 describe a method of fabricating a slim OLED by forming each device layer (i.e., a semiconductor layer and an organic light emitting diode) on two glass substrates, attaching glass substrates in such a manner that each device layer faces each other, and then removing the substrate that does not include the device layer by etching or grinding. However, according to this method, the processes of attachment and etching or grinding consumes a lot of time. According to this method, since almost completed glass substrates are attached, glass substrates, semiconductor layers and OLED devices are often damaged or broken, causing production yield to be low, resulting in high production costs. In an alternative approach, a device layer can be formed on the substrate by fabricating the glass substrate to a thickness of less than 1 mm, however such thin glass substrates can easily cause the glass substrate to bend or be damaged when it comes into contact with the fabricating apparatuses. Therefore, what is needed is an improved design for an OLED and an improved method of making the same which results in a thin OLED where production costs are better contained by improving production yield.

SUMMARY OF THE INVENTION

It is therefore an object of the present invention to provide an improved design for a thin OLED that can be used in small devices like mobile phones, personal digital assistants etc.

It is also an object of the present invention to provide a method of making the same where the production costs and production time are reduced.

It is also an object of the present invention is to provide a design and a method of making an OLED where the organic light emitting diode is protected from being exposed to UV rays during and after fabrication of the OLED.

It is further an object of the present invention to provide a method of making a thin OLED where the occurrence of bending and damage to the substrate during fabrication is reduced.

It is still an object of the present invention to reduce the time it takes to fabricate the thin OLED, resulting in higher productivity and reduced costs.

These and other objects can be achieved by an organic light emitting display (OLED) that includes a substrate, an organic light emitting diode, an insulating layer, a gate insulating layer and a semiconductor layer arranged on the substrate, the insulating layer being arranged between the organic light emitting diode and the gate insulating layer, the gate insulating layer being arranged between the insulating layer and the semiconductor layer and a non-transmissive layer arranged on the gate insulating layer, the non-transmissive layer being adapted to block UV-rays. The OLED may also include a buffer layer arranged on the substrate, a gate electrode arranged on the gate insulating layer, an inter-layer dielectric layer arranged on the gate electrode and source/drain electrodes arranged on the inter-layer dielectric layer, the insulating layer can be arranged between the source/drain electrode and the organic light emitting diode.

The non-transmissive layer can be arranged at an outer side of the semiconductor layer. The semiconductor layer and the source/drain electrodes can be coupled together by a conductive contact that penetrates through the gate insulating layer and through the inter-layer dielectric layer, and the non-transmissive layer being can be arranged at the outer side of the conductive contact. The non-transmissive layer can be arranged beneath the source/drain electrodes. The non-transmissive layer being arranged beneath the organic light emitting diode. The non-transmissive layer being arranged at portions that do not correspond to the organic light emitting diode. The non-transmissive layer being made out of a same material as that of the gate electrode. The non-transmissive layer can be of a same thickness as that of the gate electrode. The non-transmissive layer being made out of molybdenum (Mo), molybdenum tungsten (MoW), titanium (Ti), copper (Cu), aluminum (Al), aluminic neodymium (AlNd), chrome (Cr), molybdenum alloy, copper alloy, aluminum alloy, or doped poly silicon. The non-transmissive layer being an UV-light protective agent. The non-transmissive layer being made out of an UV-ray non-transmissive metal, a transmissive UV-ray protective agent metal or a non-transmissive UV-ray protective agent metal. The non-transmissive layer being made out of chrome (Cr), chrome oxide ($Cr_2O_3$), aluminum (Al), gold (Au), silver (Ag), magnesium oxide (MgO) or silver alloy (ATD). The non-transmissive layer being of a thickness between 500 Å and 3000 Å. The substrate can be of a thickness between 0.05 mm and 1 mm. The substrate can be made out of glass, plastic, polymer or steel. The OLED can also include a friction-preventing layer arranged beneath the substrate. The friction-preventing layer can be between 10 and 100 microns thick. The friction-preventing layer can be an organic material or an inorganic material.

According to another aspect of the present invention, there is provided a method of making an OLED, including preparing two substrates, attaching together the two substrates, forming a buffer layer on outside sides of the two attached substrates, forming a semiconductor layer on each buffer layer, forming a non-transmissive layer on outside sides of the semiconductor layers, forming an insulation layer on each semiconductor layer and on each non-transmissive layer, forming an organic light emitting diode each insulation layer and separating the two attached substrates.

The method can also include forming a gate insulating layer on the semiconductor layer; and forming a gate electrode on the gate insulating layer between the forming of the semiconductor layer and the forming of the non-transmissive layer. The method can instead include, after the forming of the semiconductor layer, forming a gate insulating layer on the semiconductor layer and forming a gate electrode on the gate insulating layer, wherein the forming of the non-transmissive layer occurs simultaneously with the forming of the gate electrode. The forming of the non-transmissive layer can be achieved by the forming of the non-transmissive layer on the gate insulating layer. The non-transmissive layer can be made out of a same material as that of the gate electrode. The non-transmissive layer can be arranged beneath the organic light emitting diode. The non-transmissive layer can be made of a material such as molybdenum (Mo), molybdenum tungsten (MoW), titanium (Ti), copper (Cu), aluminum (Al), aluminic neodymium (AlNd), chrome (Cr), molybdenum alloy, copper alloy, aluminum alloy or doped poly silicon. The non-transmissive layer can be an ultraviolet protective agent. The non-transmissive layer can be made out of a metal that UV-rays cannot penetrate, a permeable UV-ray protective agent, or a non-transmissive UV-ray protective agent. The non-transmissive layer can be made out of chrome (Cr), chrome oxide ($Cr_2O_3$), aluminum (Al), gold (Au), silver (Ag), magnesium oxide (MgO) or silver alloy (ATD). The attaching of the substrates can include forming a friction-preventing layer between the substrates. The method can also include removing the friction-preventing layer after the separating the substrates.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 2:
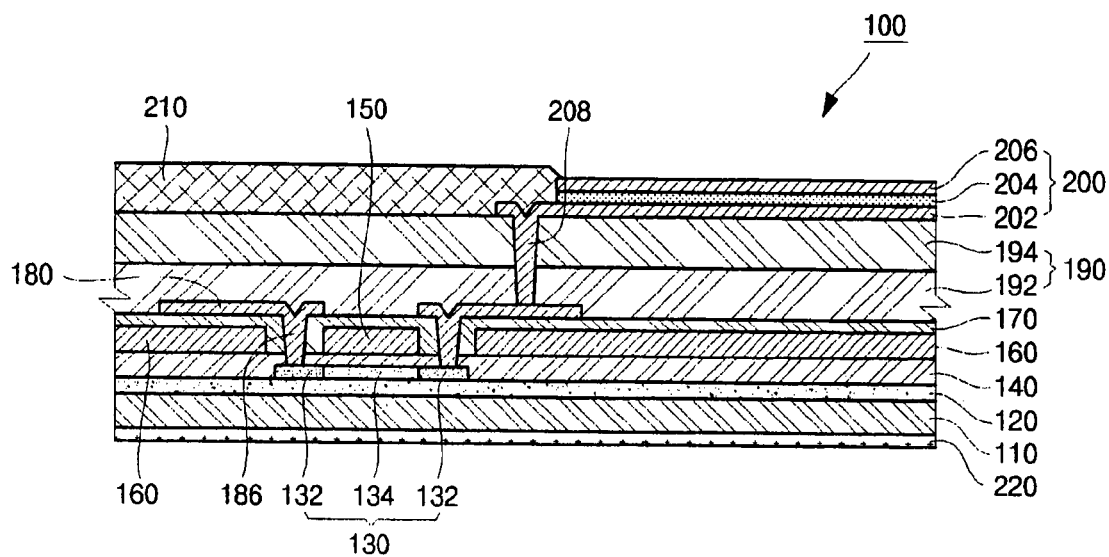
FIG. 2 is a sectional view of an organic light emitting display according to the present invention.

Turning now to the figures, FIG. 2 is a sectional view illustrating an organic light emitting display 100 according to the present invention. As illustrated in FIG. 2, the organic light emitting display (OLED) 100 includes a substrate 110, a buffer layer 120 formed on the substrate 110, a semiconductor layer 130 formed on the buffer layer 120, a gate insulating layer 140 formed on the semiconductor layer 130, a gate electrode 150 formed on the gate insulating layer 140, a non-transmissive layer 160 formed on the gate insulating layer 140, an inter-layer dielectric layer 170 formed on the gate electrode 150 and on the non-transmissive layer 160, source/drain electrodes 180 formed on the inter-layer dielectric layer 170, an insulation layer 190 formed on the source/drain electrode 180, the insulation layer being beneath the organic light emitting diode 200, the organic light emitting diode 200 formed on the insulation layer 190, a pixel-defining film 210 formed on the insulation layer 190, and a friction-preventing layer 220 formed beneath the substrate 110.

Both sides of the substrate 110 are flat, and the thickness of the substrate 110 is between 0.05 and 1 mm. When the thickness of the substrate 110 is less than 0.05 mm, the substrate can easily be damaged during washing, etching, heat-treatment processes, and application of external force. When the thickness of the substrate 110 is more than 1 mm, the resultant OLED becomes too thick to be useful in many modern devices. The substrate 110 can be made out of one of glass, plastic, polymer, steel and the equivalent, however the present invention is not limited to just these materials.

The buffer layer 120 can be formed on the upper side of the substrate 110. The buffer layer 120 prevents moisture ($H_2O$), hydrogen ($H_2$), and oxygen ($O_2$) from penetrating the substrate 110 and reaching the semiconductor layer 130 or the organic light emitting diode 200. The buffer layer 120 can be made out of a material such as silicon oxide ($SiO_2$), silicon nitride ($Si_3N_4$), an inorganic material or the equivalent, however the present invention is not limited to just these materials. The buffer layer 120 can also be omitted depending on the situation.

The semiconductor layer 130 can be formed on the upper side of the buffer layer 120. The semiconductor layer 130 includes source/drain areas 132 located at both sides thereat and facing away from each other, and a channel area 134 located between the source/drain areas 132. The semiconductor layer 130 can be a thin film transistor. The thin film transistor can be one of an amorphous silicon (Si) thin film transistor, a poly silicon (Si) thin film transistor, an organic thin film transistor, micro silicon (Si), which has a grain size between that of amorphous silicon and poly silicon or an equivalent, however the types of the thin film transistors of the present invention are not limited to just these examples. When the thin film transistor is a poly silicon thin film transistor, the poly silicon thin film transistor can be made by crystallizing the poly silicon using a laser at a low temperature, crystallizing the poly silicon using metal or crystallizing the poly silicon using high pressure, however the present invention is not limited to just these crystallization methods. The method of crystallizing the poly silicon using the laser can be achieved via Excimer Laser Annealing (ELA), Sequential Lateral Solidification (SLS) or Thin Beam Direction Crystallization (TDX), however the present invention is not limited to just these methods. The method of crystallizing the poly silicon using metal can be achieved by Solid Phase Crystallization (SPC), Metal Induced Crystallization (MIC), Metal Induced Lateral Crystallization (MILC), and Super Grained Silicon (SGS), however the present invention is not limited to just these methods. The thin film transistor can be either a PMOS, an NMOS, or an equivalent, however the conductive type of the thin film transistor is not limited to just these types.

The gate insulating layer 140 can be formed on the upper side of the semiconductor layer 130 and on exposed portions of the buffer layer 120. The gate insulating layer 140 can be made out of a material such as silicon dioxide ($SiO_2$), silicon nitride ($Si_3N_4$), an inorganic material or an equivalent, however the present invention is not limited to just these materials.

The gate electrode 150 can be formed on the upper side of the gate insulating layer 140. More specifically, the gate electrode 150 can be formed on the gate insulating layer 140 at a location corresponding to the channel area 134 of the semiconductor layer 130. The gate electrode 150 serves to apply an electric field to the channel area 134, thereby forming a hole or an electron channel in the channel area 134. The gate electrode 150 can be made out of a metal such as Mo, MoW, Ti, Cu, Al, AlNd, Cr, Mo alloy, Cu alloy, Al alloy or others, however the present invention is not limited to just these materials.

The non-transmissive layer 160 can be formed on the upper side of the gate insulating layer 140. The non-transmissive layer 160 can instead be formed underneath the semiconductor layer 130 and the conductive contact 186 which will be described later. The non-transmissive layer 160 is situated underneath the organic light emitting diode 200. The non-transmissive layer 160 can be formed not only underneath the organic light emitting diode 200, but also extend into other areas of the OLED 100. The non-transmissive layer 160 is also situated so that it overlaps a portion of the source/drain electrodes 180.

The non-transmissive layer 160 serves to prevent UV-rays from transmitting through the OLED and damaging sensitive layers within the OLED during fabrication of the organic light emitting diode 200. The non-transmissive layer 160 also prevents external UV-rays from damaging the organic light emitting diode 200 after the substrates 110 are separated from each other.

The non-transmissive layer 160 can be made out of the same material as that of the gate electrode 150. The non-transmissive layer 160 can be made out of Mo, MoW, Ti, Cu, Al, AlNd, Cr, Mo alloy, Cu alloy or an Al alloy, however the present invention is not limited to just these materials. The thickness of the non-transmissive layer 160 can be the same as the thickness of the gate electrode 150.

The non-transmissive layer 160 can be made out of a UV-ray protective agent or its equivalent. The non-transmissive layer 160 can be made out of a metal where UV-rays can not penetrate, a transparent UV-ray protective agent, an opaque UV-ray protective agent or the equivalent. When the non-transmissive layer 160 is metal, it can be made out of a material such as chrome (Cr), chrome oxide ($Cr_2O_3$), aluminum (Al), gold (Au), silver (Ag), magnesium oxide (MgO) or silver alloy (ATD), but the present invention is not limited to just these materials. The non-transmissive layer 160 can be between 500 and 3000 Å thick. When the thickness of the non-transmissive layer 160 is less than 500 Å, because the isolation rate of UV-rays are low, before or after fabrication, the semiconductor layer 130 or the organic light emitting diode 200 can be exposed. When the thickness of the non-transmissive layer 160 is more than 3000 Å, despite sufficient isolation efficiency, it can be excessively thick.

The inter-layer dielectric layer 170 can be formed on the upper side of the gate electrode 150 and the non-transmissive layer 160. The inter-layer dielectric layer 170 can be made out of one of glass, plastic, polymer or an equivalent, but the present invention is not limited to just these materials.

The source/drain electrodes 180 can be formed on the upper side of the inter-layer dielectric layer 170. The semiconductor layer 130 and each of the source/drain electrodes 180 are electrically connected by conductive contacts 186 that penetrate through the inter-layer dielectric layer 170. Further, the conductive contacts 186 can be formed in such a manner that the conductive contacts 186 do not contact the non-transmissive layer 160. Further, the source/drain electrodes 180 can be made out of a metal similar to that used in the gate electrode 150, but the present invention is not limited to just these materials. Further, such a semiconductor layer 130 (i.e., a thin film transistor) can be defined as a coplanar structure. The semiconductor layer disclosed in the present invention is not limited to the coplanar structure, but at least one of an inverted coplanar structure, a staggered structure, an inverted staggered structure, or an equivalent structure can instead used. The present invention is not limited to just these structures.

The insulation layer 190 can be formed on the upper side of the source/drain electrodes 180 and the interlayer dielectric layer 170. The insulation layer 190 can include a protective film 192, and a flat film 194 formed on the upper side of the protective film 192. The protective film 192 covers the source/drain electrodes 180 and the inter-layer dielectric layer 170, and serves to protect the source/drain electrodes 180. The protective film 192 can be made out of an inorganic film or an equivalent, but the present invention is not limited to just these materials. Moreover, the flat film 194 serves to produce a flat surface for the whole device, and can be made out of a material such as benzo cyclo butane (BCB), acryl, or an equivalent, but the present invention is not limited to just these materials.

Figure 1:
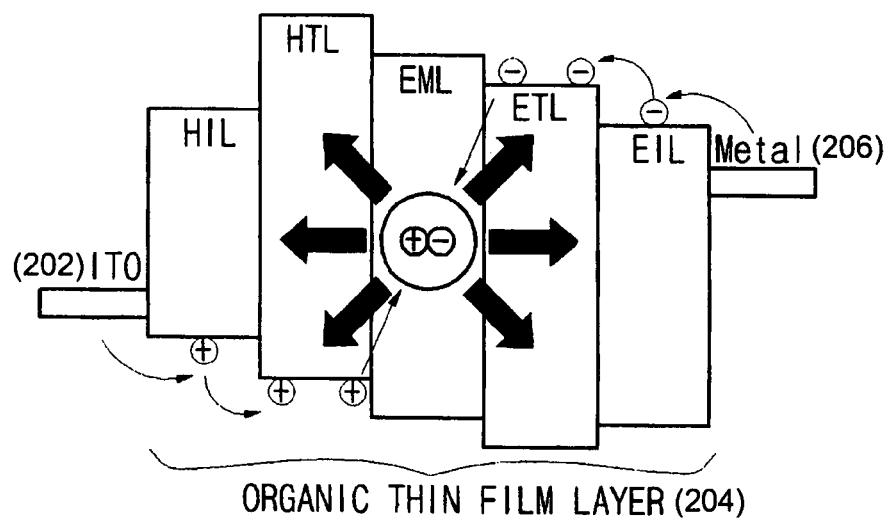
FIG. 1 is a view of an organic thin film layer.

The organic light emitting diode 200 can be formed on the insulation layer 190, that is on the upper side of the flat film 194. Such an organic light emitting diode 200 includes an anode 202, an organic light-emitting thin film 204 formed on the upper side of the anode 202, and a cathode 206 formed on the upper side of the organic light-emitting thin film 204. The anode 202 made out of a material such as indium tin oxide (ITO), ITO/Ag, ITO/Ag/ITO (IZO: indium zinc oxide), but the present invention is not limited to just these materials. ITO is a transparent conductive film having a small hole injection wall on the organic light-emitting thin film 204 because of uniformity of work functions, and the Ag is a film that reflects light from the organic light-emitting thin film 204 to the upper side of the display. Further, as illustrated in FIG. 1, the organic light-emitting film 204 can include an emitting layer (EML) that emits light by forming an exciton, an electron transport layer (ETL) that appropriately regulates the speed of electrons, and a hole transport layer (HTL) that appropriately regulates the speed of holes. Further, an electron injection layer (EIL) that improves the electron-injecting efficiency can be formed on the electron transport layer, a hole-injecting layer (HIL) that improves the hole-injecting efficiency can be formed on the hole transport layer. Moreover, the cathode 206 can be made out of a material such as Al, MgAg alloy, MgCa alloy or an equivalent, but the present invention is not limited to just these materials. However, in case the front light-emitting type OLED 100, the Al needs to be very thin. When the Al is made thin, the resistance becomes high and the electron-injecting wall becomes large, which are disadvantageous. The electron-injecting wall of the MgAg alloy is small compared with that of Al, and the electron-injecting wall of the MgCa alloy is lower than that of the wall of the MgAg alloy. However, such a MgAg alloy and MgCa alloy are sensitive to surrounding environments, and can become oxidized, thus forming an insulating layer. Hence, an isolation from the outside needs to be present. Moreover, the anode 202 and the source/drain electrodes 180 of the organic light emitting diode 200 can be electrically connected to each other by an electrically-conductive via 208 penetrating the insulation layer 190. Further, the present invention has been described for a front light-emitting type device that emits light towards the upper side of the substrate 110, but the present invention is not limited to this as the present invention can also apply to a backside light-emitting type device that emits light towards the lower direction of the substrate 110, or the present invention can instead apply to a device that emits light to both-sides at the same time.

The pixel-defining film 210 can be formed on the upper side of the insulation layer 190. Such a pixel-defining film 210 makes the light-emitting boundary area between pixels clear by making the boundary between the red organic light emitting diode, the green organic light emitting diode, and the blue organic light emitting diode clear. Further, such a pixel-defining film 210 can be made out of a material such as polyimide or an equivalent, but the present invention is not limited to just these materials.

Further, a friction-preventing layer 220 can be formed beneath the substrate 110. Such a friction-preventing layer 220 attaches two substrates 110 together, so that both substrates 110 do not contact each other during forming the semiconductor layer 130 and the organic light emitting diode 200. Further, such a friction-preventing layer 220 secures that there will be sufficient rigidity by making the attached substrates thick so that the resultant structure will not be bent or damaged during transport or other processes. Such a friction-preventing layer 220 can be made out of an organic material, an inorganic material, or an equivalent, but the present invention is not limited to just these materials. Further, it is preferable for the friction-preventing layer 220 to be formed to have a thickness between 10 and 100 μm. When the thickness of the friction-preventing layer 220 is less than 10 μm, the substrates can contact each other during the fabrication process. When the thickness of the friction-preventing layer 220 is more than 100 μm, the substrates 110 can become excessively thick.

Figure 3:
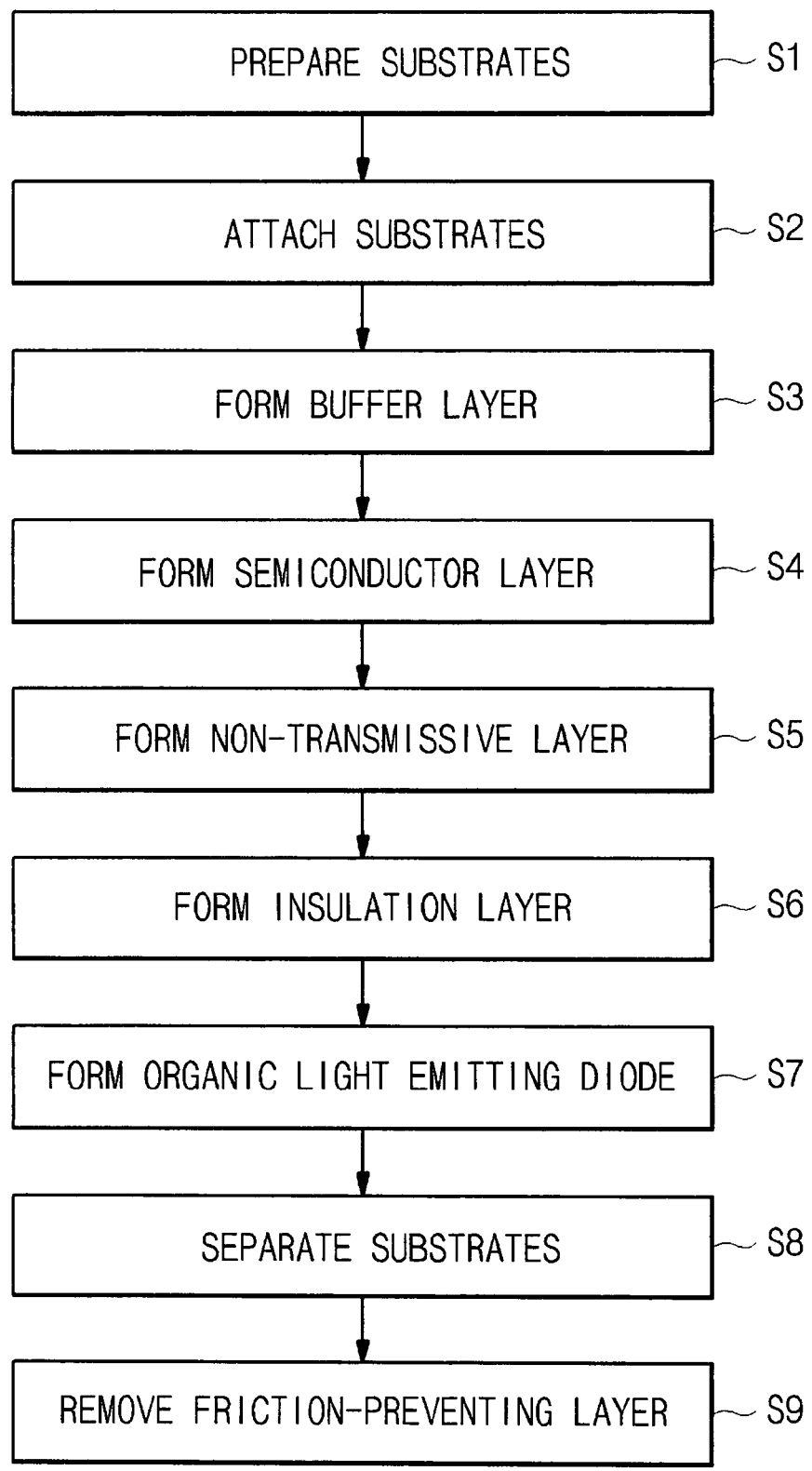
FIG. 3 is a flowchart illustrating a method of fabricating the organic light emitting display of FIG. 2.

Referring now to FIG. 3, FIG. 3 is a flowchart describing a method of fabricating the organic light emitting display device (OLED) 100 of FIG. 2. As illustrated in FIG. 3, the method of fabricating the OLED 100 can include preparing substrates S1, attaching substrates S2, forming a buffer layer S3, forming a semiconductor layer S4, forming a non-transmissive layer S5, forming an insulation layer S6, forming an organic light emitting diode S7, separating the substrates S8, and removing a friction-preventing layer S9.

Turning now to FIGS. 4A to 4J, FIGS. 4A to 4J are sectional views illustrating the fabrication process of the organic light emitting display (OLED) 100 according to the present invention. Referring to FIGS. 3, and 4A to 4J, the method of fabricating an OLED is described in order.

First, in step S1 of preparing the substrates 110, substrates 110 with uniform thickness and whose upper lower sides are flat are provided. The substrate 110 can be one of glass, plastic, polymer, steel, and the equivalent, but the present invention is not limited to just these materials. Further, it is preferable that the thickness of the substrates 110 be between 0.05 and 1 mm. When the thickness of each substrate 110 is less than 0.05 mm, the substrates can be easily damaged during washing, etching or heat-treatment processes, hard to handle, and easy to be destroyed by external force. Further, when the thickness of the substrates 110 is more than 1 mm, it is difficult to achieve a thickness for the overall device that can be used in today's slim devices.

Figure 4A:
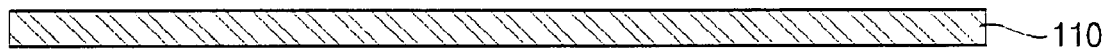
FIGS. 4A to 4J are sectional views illustrating the order of the fabrication process of the organic light emitting display according to the present invention.
Figure 4B:
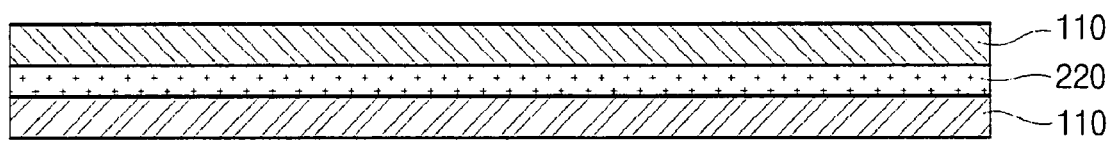

As illustrated in FIG. 4B, in step S2 of attaching the substrates 110 together, the substrates are mutually attached together. The purpose for attaching the two substrates together for fabrication is 1) so that two display devices can be formed together thereby increasing throughput and reducing production time and 2) so that a thicker structure is handled during fabrication so that it is less apt to break or be damaged during fabrication, thereby improving production yield. Here, the friction-preventing layer 220 can be interposed between the two substrates 110 in such a manner that the two substrates 110 do not directly contact each other, while providing a certain rigidity during the fabrication process. The friction-preventing layer 220 can be made by attaching or coating an organic material, an inorganic material, or an equivalent, however the present invention is not limited to just these materials. Here, if the friction-preventing layer 220 is removed after the OLED is completed, it is preferred that the friction-preventing layer 220 is made out of a material that is easily removable. For example, photo resist, which is an organic material, can be used, but the present invention is not limited to this material. Moreover, adhesives (not shown) can be also interposed in such a manner that two substrates 110 are not separated from each other during the fabrication processes. Such adhesives can be an epoxy adhesive, a UV light-hardening adhesive, or an equivalent, but the present invention is not limited to just these adhesives. Further, the friction-preventing layer 220 can be formed on each substrate 110 in advance prior to attachment, however after the two substrates 110 are interposed for attachment, the liquid friction-preventing layer 220 can be injected into the crevice formed between the two substrates 110 for formation because the injection is easy because of capillary forces. Here, it is preferable for the friction-preventing layer 220 to be hardened by heat-treating the substrates 110 at predetermined temperature after the formation of such a liquid friction-preventing layer 220.

Figure 4C:
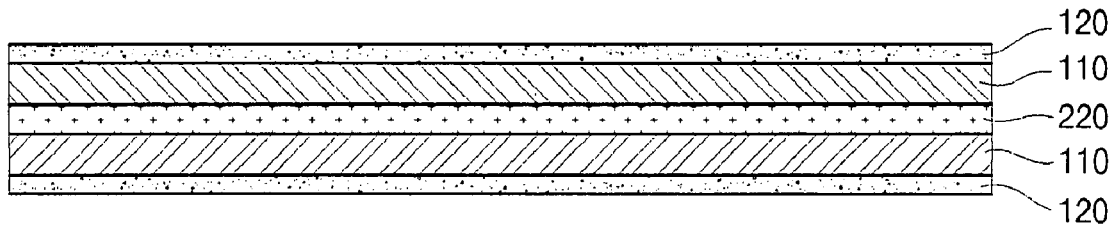

As illustrated in FIG. 4C, in step S3 of forming the buffer layer 120, a predetermined thickness of buffer layer 120 is formed on the surface of each substrate 110 on opposite sides of the two substrate structure away from a side where the friction-preventing layer 220 is formed. The buffer layer 120 can be made out of a silicon oxide film, a silicon nitride film, an inorganic film, or an equivalent. The buffer layer 120 is included so that moisture, hydrogen, or oxygen can not be transmitted to the semiconductor layer 130 or the organic light emitting diode 200. The buffer layer 120 also makes it easier to form the semiconductor layer 130 on the surface. The buffer layer 120 can be first formed on the substrate 110 of one side, and then be formed on another substrate 110 in order, or can be formed on both substrates 110 at the same time.

Figure 4D:
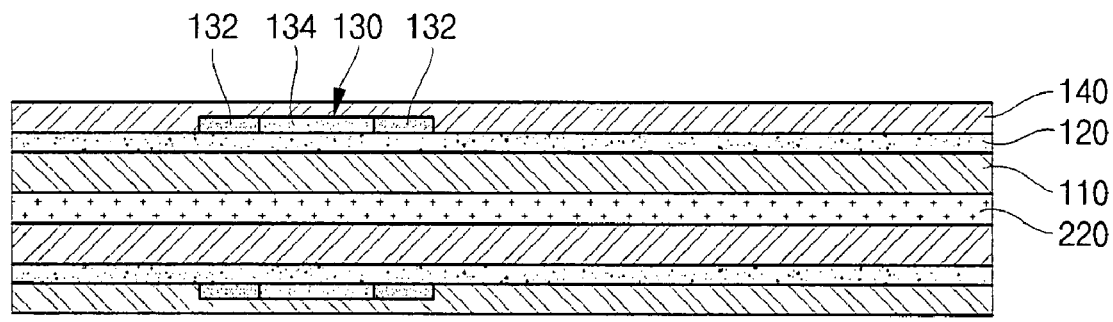

As illustrated in FIG. 4D, in step S4 of forming the semiconductor layer 130, the semiconductor layer 130 is formed on the surface of the buffer layer 120, and the gate insulating layer 140 is then formed on the resultant structure. The semiconductor layer 130 includes the source/drain areas 132 on both sides facing away from each other, and includes the channel area 134 between the source/drain areas 132. For example, the semiconductor layer 130 can be a thin film transistor. Such a thin film transistor can be an amorphous silicon thin film transistor, a poly silicon thin film transistor, an organic thin film transistor, a micro silicon thin film transistor, or an equivalent, but the present invention is not limited to just these transistors.

Further, when the thin film transistor is a poly silicon thin film transistor produced after the amorphous silicon is formed on the buffer layer 120, crystallization can be performed using one of a laser at low temperature, a metal, high pressure, or an equivalent, however, the present invention is not limited to just these methods.

Here, the amorphous silicon can be formed using PECVD, LPCVD, sputtering, or an equivalent, but the present invention is not limited to just these methods. Moreover, after crystallizing amorphous silicon, a desired number of semiconductor layers 130 are formed at the desired locations via photo resist application, illumination, developing, etching, and photo resist peeling processes.

Further, some examples of methods of crystallizing amorphous silicon into poly silicon are excimer laser annealing (ELA), sequential lateral solidification (SLS), and thin beam direction crystallization (TDX), but the present invention is not limited to just these methods. Some examples of methods of crystallizing using metal are solid phases crystallization (SPC), metal induced crystallization (MIC), metal induced lateral crystallization (MILC), and super grained silicon (SGS), but the present invention is not limited to just these methods. Further, the thin film transistor can be one of PMOS, NMOS, or an equivalent, but the present invention is not limited to just these structures.

A predetermined thickness of the gate insulating layer 140 is formed on the surface of the semiconductor layer 130 using one of PECVD, LPCVD, sputtering, or an equivalent method. Here, the gate insulating layer 140 can also be formed on the buffer layer 120. Further, the gate insulating layer 140 can be made out of a silicon oxide film, a silicon nitride film, an inorganic film, or an equivalent, but the present invention is not limited to just these materials.

Figure 4E:
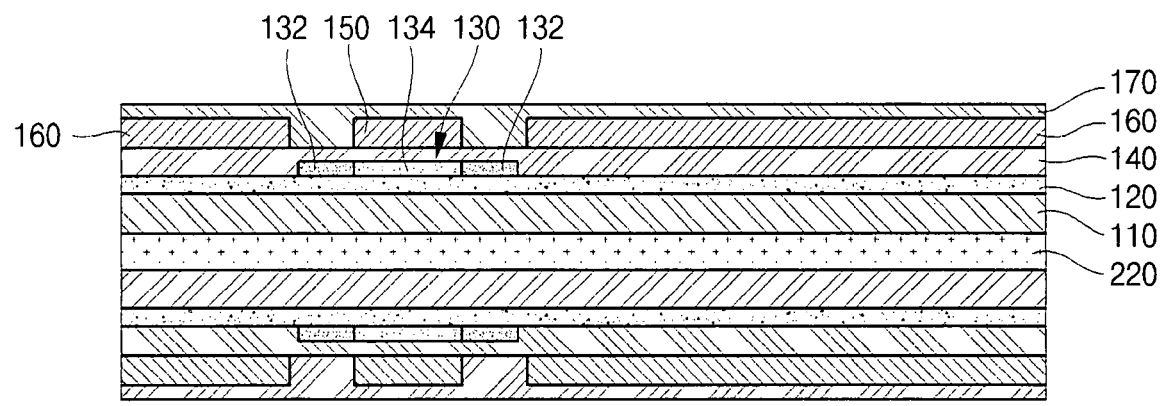

As illustrated in FIG. 4E, the gate electrode 150 can be formed on the upper side of the gate insulating layer 140 by one of PECVD, LPCVD, sputtering, or an equivalent. Here, a desired number of gate electrodes 150 are formed at the desired position through photo resist application, illuminating, developing, etching, and photo resist peeling processes after the deposition process. That is, the gate electrode 150 can be formed on the gate insulating layer 140 at a location that corresponds to the channel area 134 of the semiconductor layer 130. Such a gate electrode 150 produces an electric field in the channel area 134, whereby the hole or electron channel is formed in the channel area 134. Further, the gate electrode 150 can be made out of a metal such as Mo, MoW, Ti, Cu, Al, AlNd, Cr, Mo alloy, Cu alloy, or Al alloy, doped poly silicon, or an equivalent, but the present invention is not limited to just these materials.

Further, as illustrated in FIG. 4E, in step S5 of forming the non-transmissive layer 160, the non-transmissive layer 160 can be formed simultaneously with the forming of the gate electrode 150. Here, the non-transmissive layer 160 is formed at a location that is at a certain distance from the semiconductor layer 130 and the gate electrode 150 in such a manner that the non-transmissive layer 160 does not contact the conductive contact 186 that electrically connects the source/drain electrodes 180 to the source/drain areas 132. Further, the non-transmissive layer 160 is widely formed on an area beneath the organic light emitting diode 200 so that UV-rays do not reach the organic light emitting diode 200 during formation. Further, the non-transmissive layer 160 can be formed of the same material and to the same thickness as that of the gate electrode 150. That is, the non-transmissive layer 160 can be formed using at least one of Mo, MoW, Ti, Cu, Al, AlNd, Cr, Mo alloy, Cu alloy, Al alloy, doped poly silicon, and the equivalent, but the present invention is not limited to just these materials. Here, the non-transmissive layer 160 is used in such a manner that the outside UV-rays do not penetrate the organic light emitting diode 200, but instead are reflected after the substrates 110 have been separated.

Further, the non-transmissive layer 160 can be made out of a UV-ray protective agent or an equivalent. That is, the non-transmissive layer 160 can be made out of one of a metal that UV-rays cannot penetrate, a transparent UV-ray protective agent, an opaque UV-ray protective agent or an equivalent. Further, in case that the non-transmissive layer 160 is metal, the non-transmissive layer 160 can be chrome (Cr), chrome oxide ($Cr_2O_3$), aluminum (Al), gold (Au), silver (Ag), magnesium oxide (MgO), silver alloy (ATD) or an equivalent, however the present invention is not limited to just these materials. Further, it is preferable for such a non-transmissive layer 160 be between 500 and 3000 Å thick. When the thickness of the non-transmissive layer 160 is less than 500 Å, because the UV-ray isolation rate is low, both before or after the fabricating processes, the organic light emitting diode 200 can be exposed to some UV rays. When the thickness of the non-transmissive layer 160 is more than 3000 Å, the non-transmissive layer 160 can be excessively thick despite the sufficient UV-ray isolation rate.

The non-transmissive layer 160 can be made by plasma enhanced chemical vapor deposition (PECVD), low pressure chemical vapor deposition (LPCVD), sputtering, coating or an equivalent, however the present invention is not limited to just these methods. Here, such a non-transmissive layer 160 can be formed first on the substrate of one side, then on the other substrate in order, or can instead be formed on both substrates at the same time.

As illustrated in FIG. 4E, an inter-layer dielectric layer 170 can be formed on the upper side of the gate electrode 150 and the non-transmissive layer 160. The inter-layer dielectric layer 170 can be made out of one of polymer, plastic, glass, or an equivalent, but the present invention is not limited to just these materials. Here, the area corresponding to the source/drain areas 132 are used in such a manner that the source/drain areas 132 are exposed to the outside through etching. This exposed portion becomes a contact hole, and a conductive contact 186 is formed in this contact hole.

Figure 4F:
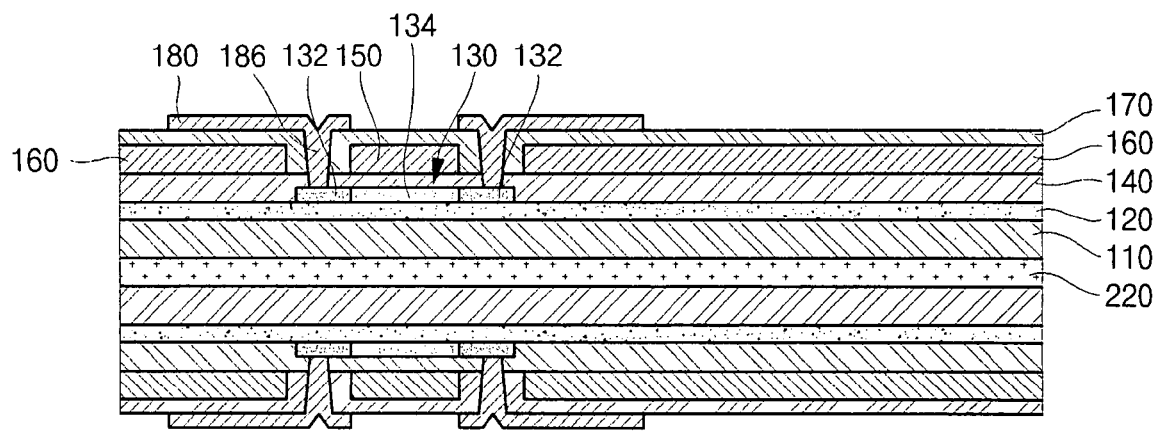

Further, as illustrated in FIG. 4F, the source/drain electrodes 180 are produced by either PECVD, LPCVD, sputtering, or an equivalent on the upper side of the inter-layer dielectric layer 170. Here, a desired number of source/drain electrodes 180 are formed at the desired position through photo resist application, illuminating, developing, etching, and photo resist peeling processes after the deposition. Here, a certain area of the source/drain electrodes 180 can overlap the non-transmissive layer 160. An electrically-conductive contact 186 that penetrates the inter-layer dielectric layer 170 is formed between the source/drain electrodes 180 and the source/drain areas 132 of the semiconductor layer 130. Here, the conductive contact 186 is charged in advance. Moreover, the conductive contact 186 is designed not to contact the non-transmissive layer 160.

The semiconductor layer 130 and the source/drain electrodes 180 are electrically connected by the conductive contacts 186. Such a conductive contacts 186 can be formed using materials similar to those used to form the gate electrode 150 and the source/drain electrodes 180, however the present invention is in no way so limited. Further, the source/drain electrodes 180 can be made out of the same metal materials used to form the gate electrode 150, however the present invention is in no way so limited. The semiconductor layer 130 used to form the thin film transistor is defined by a general coplanar structure. However, the semiconductor layer 130 according to the present invention can instead be of an inverted coplanar structure, a staggered structure, an inverted staggered structure, or an equivalent, but the present invention is not limited to just these structures.

The semiconductor layer 130, the gate insulating layer 140, the gate electrode 150, the non-transmissive layer 160, and the inter-layer dielectric layer 170 are formed on one of the substrates 110 and then on the other of the two substrates 110. That is, the semiconductor layer 130, the gate insulating layer 140, the gate electrode 150, the non-transmissive layer 160, and the inter-layer dielectric layer 170 are completed on one of the two substrates 110, and the semiconductor layer 130, the gate insulating layer 140, the gate electrode 150, the non-transmissive layer 160, and the inter-layer dielectric layer 170 are then completed on the other of the two substrates 110. Alternatively, the elements 130, 140, 150, 160, and 170 can be formed in order, exchanging the substrates of one side and the other side. Alternatively, the elements 130, 140, 150, 160, and 170 can be formed on both substrates at the same time if proper equipment is available.

Figure 4G:
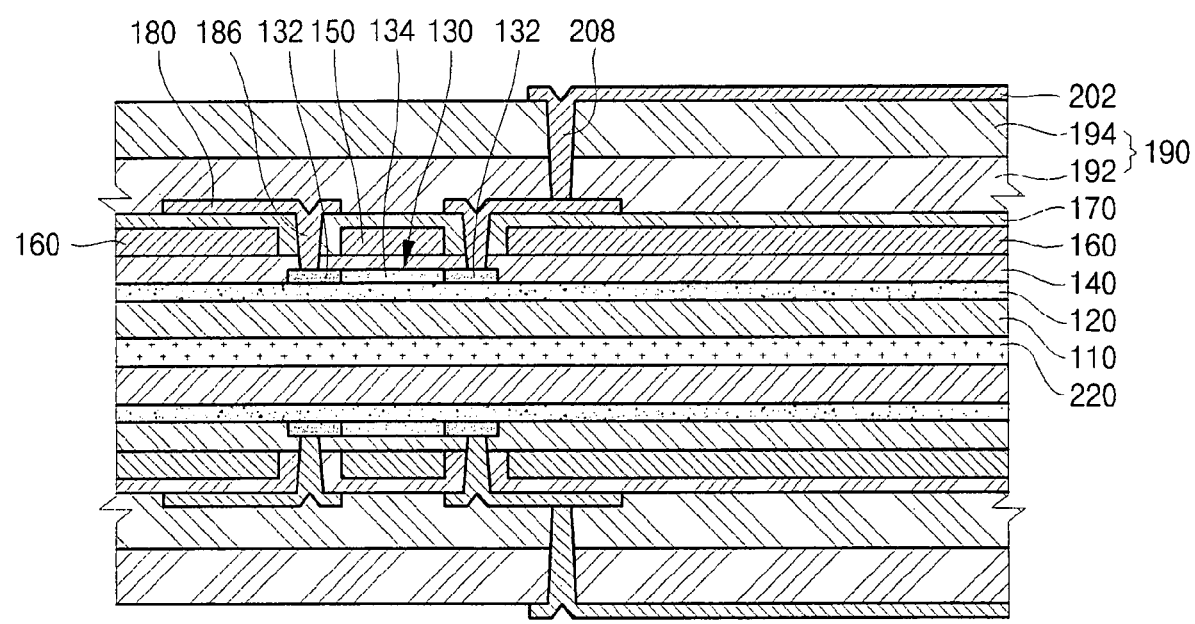

As illustrated in FIG. 4G, in step S6 of forming the insulation layer 190, the insulation layer 190 is formed the top side of the inter-layer dielectric layer 170. The insulation layer 190 includes the protective film 192 and the flat film 194. Here, the protective film 192 is formed first, and the flat film 194 is then formed on the protective film 192. The protective film 192 covers the source/drain electrodes 180 and the inter-layer dielectric layer 170, and protects the source/drain electrodes 180 and the gate electrode 150. The via hole 208 is formed in advance by etching the area corresponding to the source/drain electrodes 180 in the protective film 192 and in the flat film 194. The protective film 192 can be an inorganic film or an equivalent, but the present invention is not limited to just these materials. Moreover, the flat film 194 is formed on the protective film 192. The flat film 194 makes the surface of the whole device flat, and can be made by coating or depositing at least one of benzo cyclo butane, acryl, or an equivalent, but the present invention is not limited to just these materials and methods.

After the insulation layer 190 is formed at the substrate 110 on one side, the insulation layer 190 can be formed on the other substrate 110 on the other side. That is, the insulation layer 190 is first completed on one of the two substrates 110 and then the insulation layer 190 is formed on the other substrate 110 facing the other way. Moreover, such an insulation layer 190 can be formed in order, exchanging the substrates of one side and the other side. Further, the insulation layer 190 can be formed on both substrates at the same time if proper equipment is available.

Figure 4H:
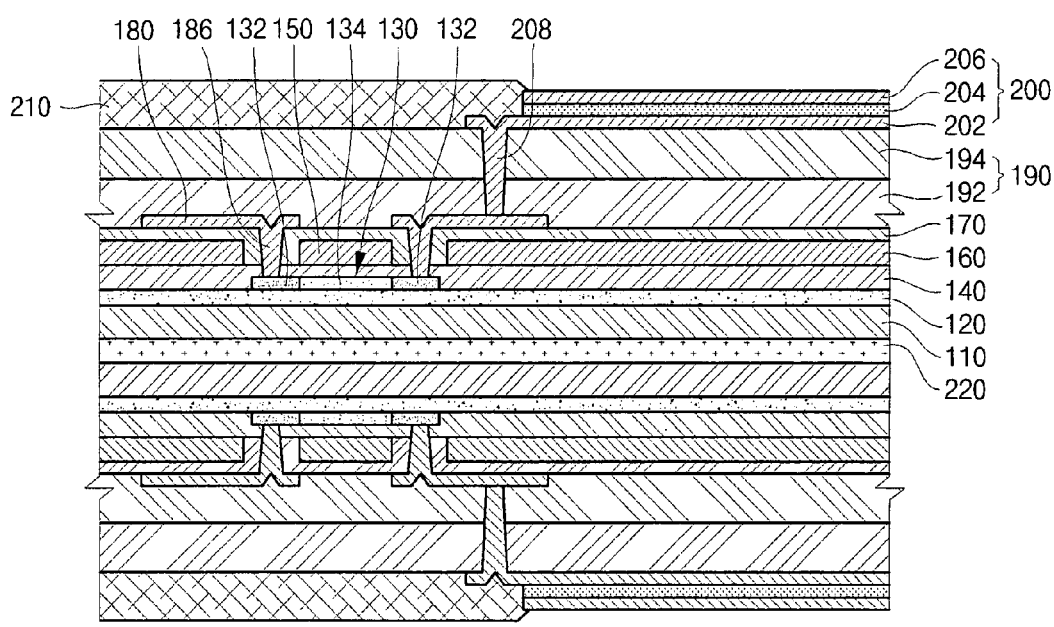

As illustrated in FIG. 4H, in step S7 of forming the organic light emitting diode 200, the organic light emitting diode 200 is formed on the insulation layer 190. Specifically, the anode 202, the organic light-emitting thin film 204, and the cathode 206 are formed in order on insulation layer 190.

The anode 202 can be made out of one of ITO(Indium Tin Oxide), ITO(Induim Tin Oxide)/Ag, ITO(Induim Tin Oxide) Ag/ITO(IZO: Indium Zinc Oxide), or an equivalent, but the present invention is not limited to just these materials. The anode 202 can be formed by RF sputtering, DC sputtering, ion beam sputtering, or a vacuum deposition method. After deposition, a desired area of anode 202 is formed through photo resist application, illuminating, developing, etching, and photo resist peeling processes. Here, the anode 202 is electrically connected to one of the source/drain electrodes 180 through the conductive via 208 that penetrates through the insulation layer 190. Because the work function of the ITO is uniform, the hole-injecting wall on the organic light-emitting film 204 is used as a transparent conductive film, and the Ag reflects the light, especially from the organic light-emitting thin film 204, in the front light-emitting type display.

As illustrated in FIG. 1, the organic light-emitting thin film 204 can be made by forming a hole injecting layer (HIL) that improves the injection efficiency of holes, a hole transport layer (HTL) that regulates the speed of the movement of holes, an emitting layer (EML) that emits light by forming an exciton by the recombination of electrons and holes, an electron transport layer (ETL) that regulates the speed of the movement of electrons, and an electron injection layer (EIL) that improves the injection efficiency of electrons, but the present invention is not limited to this structure. The organic light-emitting thin film 204 can be made out of a wet coating method such as spin coating, deep coating, spraying, screen printing, or inkjet printing, or by a dry coating method such as sputtering or vacuum depositing.

The cathode 206 is formed on the surface of the electron injection layer of the organic light-emitting thin film 204. The cathode 206 can be made by depositing at least one of Al, MgAg alloy, MgCa alloy, or an equivalent, but the present invention is not limited just to these materials for the cathode 206, or to these methods of forming. For example, the cathode 206 can be made out of one of RF sputtering, DC sputtering, ion beam sputtering or vacuum deposition. Then, a desired area of cathode 206 is formed at the desired position through photo resist application, illuminating, developing, etching, and photo resist peeling processes.

Moreover, in case the front light-emitting type display, if the Al is used as the cathode 206, the cathode needs to be very thin in order to make the light transmission rate high. In such a case, because the resistance gets high, the electron-injecting wall can be large. Hence, in such a case, at least one of MgAg alloy, MgCa alloy, or an equivalent whose electron-injecting wall is lower than that of Al can be used. Further, the cathode 206 can be made out of one of ITO and IZO. Because the MgAg alloy and the MgCa alloy are sensitive to surrounding environments, the isolation from the outside needs to be completely accomplished when these alloys are used.

Moreover, after the formation of such a cathode 206, the pixel-defining film 210 is formed in such a manner that the boundary between the organic light emitting diodes 200 becomes clear. Such a pixel-defining film 210 is made by coating or depositing at least one of a polyimide or an equivalent. Here, after such coating and deposition, the organic light emitting diode 200 is exposed to the outside through photo resist application, illuminating, developing, etching, and photo resist peeling processes.

Moreover, the present invention has been described focusing on the front light-emitting display where the image is emitted towards an upper direction of the substrate, but the present invention is not limited to front emitting structures as backside light-emitting type or the both sides light-emitting type are possible.

After the organic light emitting diode 200 is formed on one substrate 110 at one side, an organic light emitting diode 200 can be formed on the other substrate 110 facing the other way.

That is, the organic light emitting diode 200 is completed first on one of the two substrates 110, and the organic light emitting diode 200 is completed on the other of the two substrates 110 facing the opposite direction. Alternatively, such an organic light emitting diode 200 can be formed in order, exchanging the substrates of one side and the other side. Alternatively, the organic light emitting diode 200 can be completed at both substrates simultaneously of proper equipment is available.

Figure 4I:
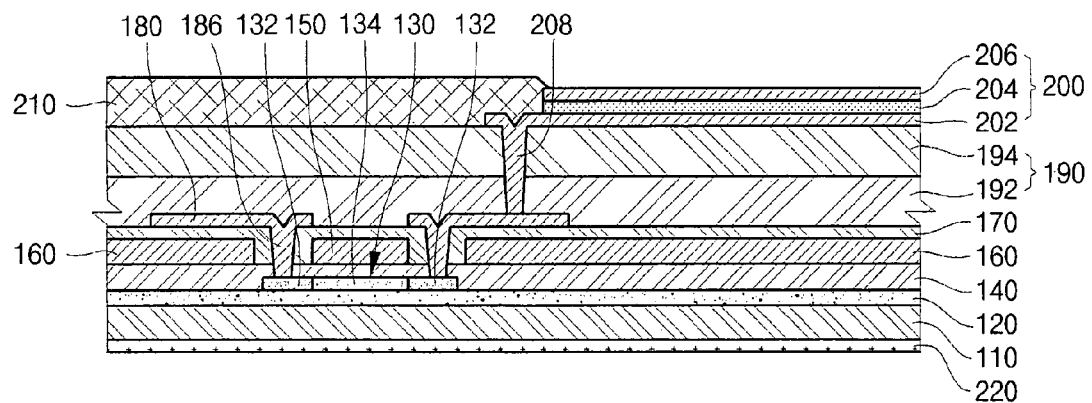
Figure 4I:
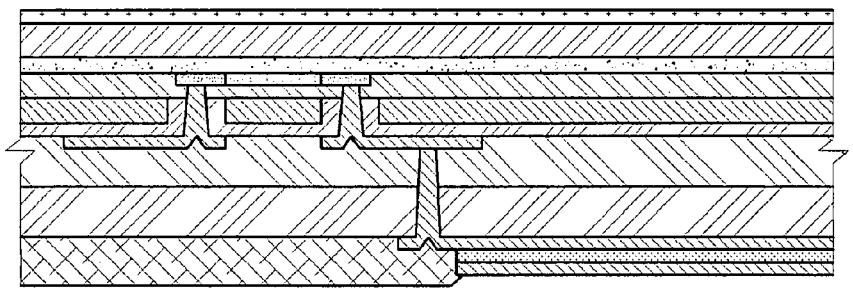

As illustrated in FIG. 4I, in step S8 of separating substrates, the substrates 110 that have been attached and processed are individually separated. That is, the two substrates 110 are separated by removing the adhesives using a sawing tool or other tools. Here, the friction-preventing layer 220 still remains on one of the two substrates 110 after the separation of the substrates 110. Further, though not illustrated in drawings, before or after sawing, the process of attaching a sealing substrate using a sealant can be included. Here, a transparent moisture absorbent material can be included in the sealing substrate in order to absorb moisture.

The present invention can be completed by the separation process of the two substrates 110. That is, after the separation of the substrates 110, the completed OLED 100 can be delivered as a product after the cell test, flexible printed circuit (FPC) bonding, module test, and reliability test. The cell test can be conducted by making a separate area for the cell test.

Further, in the case where the separation step S8 of the substrates 110 becomes the last process, the friction-preventing layer 220 can still remain on the surface of one side of the substrate 110 of the completed OLED 100. Such a friction-preventing layer 220 can serve to block the penetration of UV-rays, and protect the surface of the substrate 110 from the surrounding environments.

According to the present invention, for example, in case the thickness of the substrates 110 is less than 0.5 mm, since the two substrates 110 are attached for fabricating processes, the substrates 110 form a combined structure that is more than 1 mm thick during the fabrication processes. Hence, because the rigidity of the attached substrates 110 becomes high as a result of its combined thicknesses, the substrates are not bent and damaged, and the forming of the semiconductor layer and the forming of the organic light emitting diode can be easily achieved. Further, after the completion of products, the substrates 110 are separated, thereby producing slim substrates of about 0.5 mm.

Figure 4J:
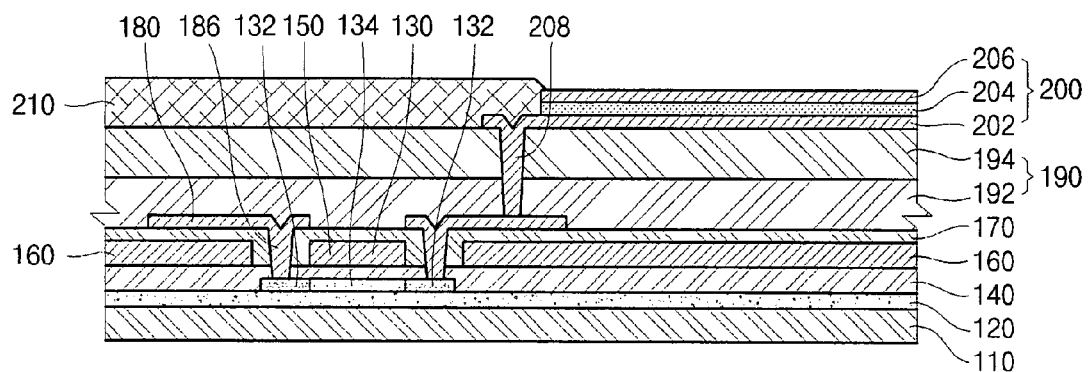

As illustrated in FIG. 4J, in step S9 of removing the friction-preventing layer 220 from the upper substrate 110 occurs. The friction-preventing layer 220 is removed from the substrate 110 using a chemical solution or a grinder. Hence, when such a friction-preventing layer 220 is removed, no friction-preventing layer 220 remains on the surface of the substrate 110, and the substrate becomes thinner. When the remaining friction-preventing layer 220 remains on the substrate 110, it serves to block UV-rays and protect against outside impact. However, since the non-transmissive layer 160 has been formed within the OLED 100, it is not absolutely necessary for the friction-preventing layer 220 to remain on the substrate 110 of the finished OLED 100.

By using substrates 110 of a thickness between 0.05 mm and 1 mm, the OLED 100 according to the present invention can be easily applied to various slim electronic appliances as displays, such as a mobile phone, a personal digital assistant, a lap-top computer, a computer monitor, and a television. Further, by including a non-transmissive layer within the OLED, the OLED according to the present invention is made in such a manner that UV-rays do not impinge on the organic light emitting diode through the substrate during use. Further, by attaching two substrates of thicknesses between 0.05 and 1 mm together during fabrication, and performing semiconductor processes and organic thin film processes such as washing, etching, illuminating, developing, and heat treatment), the method of fabricating an OLED according to the present invention reduces time that takes in all processes by about 50%.

Further, by forming a non-transmissive layer underneath the organic light emitting diode, according to the fabricating method of the present invention, UV-rays are not easily transmitted to the other substrates of the opposite side. Further, by forming a friction-preventing layer to a predetermined thickness between attached substrates, and reinforcing rigidity according to the fabricating method of the present invention, the substrate is not bent or destroyed during fabrication. Further, by forming a friction-preventing layer between attached substrates, the fabricating method according to the present invention prevents contacts between substrates when two substrates are attached, thus preventing the damage of the substrates.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. An organic light emitting display (OLED), comprising:
a substrate;
an organic light emitting diode, an insulating layer, a gate insulating layer and a semiconductor layer arranged on the substrate, the insulating layer being arranged between the organic light emitting diode and the gate insulating layer, the gate insulating layer being arranged between the insulating layer and the semiconductor layer, the semiconductor layer including a source area, a drain area and a channel area arranged between the source area and the drain area; and
a non-transmissive layer and a gate electrode arranged on the gate insulating layer, wherein the non-transmissive layer and the gate electrode are adapted to block UV-rays, the non-transmissive layer and the gate electrode extending across all of an area of the OLED except at a portion corresponding to contacts to the source area and the drain area of the semiconductor layer, wherein the substrate is of a thickness between 0.05 mm and 1 mm.

2. An organic light emitting display (OLED), comprising:
a substrate;
an organic light emitting diode, an insulating layer, a gate insulating layer and a semiconductor layer arranged on the substrate, the insulating layer being arranged between the organic light emitting diode and the gate insulating layer, the gate insulating layer being arranged between the insulating layer and the semiconductor layer; and
a non-transmissive layer and a gate electrode arranged on the gate insulating layer, wherein the non-transmissive layer and the gate electrode are adapted to block UV-rays, the non-transmissive layer and the gate electrode being on a same level and being comprised of a same material, the non-transmissive layer and the gate electrode extends across substantially all of an area of the OLED.

3. The OLED of claim 2, the friction-preventing layer having a thickness of 10 to 100 μm.

4. The OLED of claim 2, the friction-preventing layer being arranged on an opposite side of the substrate from the organic light emitting diode, the insulating layer, the gate insulating layer and the semiconductor layer.

5. The OLED of claim 2, the organic light emitting diode, the insulating layer, the gate insulating layer and the semiconductor layer being arranged on top of the substrate.

* * * * *